United States Patent
Tanaka et al.

(10) Patent No.: US 9,355,846 B2
(45) Date of Patent: May 31, 2016

(54) NON-UNIFORM SILICON DIOXIDE AND AIR GAP FOR SEPARATING MEMORY CELLS

(75) Inventors: Masayuki Tanaka, Yokohama (JP);
Kenichiro Toratani, Fujisawa (JP);
Kazuhiro Matsuo, Yokkaichi (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 209 days.

(21) Appl. No.: 13/597,337

(22) Filed: Aug. 29, 2012

(65) Prior Publication Data
US 2013/0241068 A1 Sep. 19, 2013

(30) Foreign Application Priority Data

Mar. 16, 2012 (JP) .................. 2012-060835

(51) Int. Cl.
*H01L 21/02* (2006.01)
*H01L 23/498* (2006.01)
*H01L 21/768* (2006.01)

(52) U.S. Cl.
CPC ...... *H01L 21/02697* (2013.01); *H01L 21/7682* (2013.01); *H01L 21/76801* (2013.01); *H01L 21/76829* (2013.01); *H01L 23/49866* (2013.01); *H01L 2924/0002* (2013.01)

(58) Field of Classification Search
CPC .................. H01L 21/28247; H01L 21/02697; H01L 21/7682; H01L 27/115; H01L 27/11521; H01L 21/28273; H01L 29/7883; H01L 21/8239; H01L 27/105; H01L 27/10894; H01L 27/112; H01L 21/823468; H01L 29/6656; H01L 29/6659; H01L 21/823864; H01L 21/823814
USPC .................................................. 257/761.763
See application file for complete search history.

(56) References Cited

U.S. PATENT DOCUMENTS

| 6,525,367 | B1 | 2/2003 | Moriyama |
| 6,867,152 | B1 | 3/2005 | Hausmann et al. |

(Continued)

FOREIGN PATENT DOCUMENTS

| JP | 2001-94093 A | 4/2001 |
| JP | 2007-258583 A | 10/2007 |

(Continued)

OTHER PUBLICATIONS

Bristow et al., Microscopic origin of the optical processes in blue sapphire, May 1, 2013, RCS Publishing, Chem. Commun., 2013, 49, 5259-5261.*

(Continued)

*Primary Examiner* — Stephen W Smoot
*Assistant Examiner* — Pavel Ivanov
(74) *Attorney, Agent, or Firm* — Oblon, McClelland, Maier & Neustadt, L.L.P

(57) ABSTRACT

According to one embodiment, a method for forming a semiconductor device includes: forming a first underlayer film that contains a first chemical element selected from the group consisting of germanium, aluminum, tungsten, hafnium, titanium, tantalum, nickel, cobalt and alkaline earth metals; forming, on the first underlayer film, a second underlayer film that contains a second chemical element selected from the group consisting of germanium, aluminum, tungsten, hafnium, titanium, tantalum, nickel, cobalt and alkaline earth metals, the second chemical element being an chemical element not contained in the first underlayer film; and forming, on the second underlayer film, a silicon oxide film by a CVD or ALD method by use of a silicon source containing at least one of an ethoxy group, a halogen group, an alkyl group, and an amino group, or a silicon source of a siloxane system.

5 Claims, 7 Drawing Sheets

(56) References Cited

U.S. PATENT DOCUMENTS

| | | | |
|---|---|---|---|
| 7,166,889 B2* | 1/2007 | Tsunoda et al. | 257/321 |
| 7,446,335 B2 | 11/2008 | Kortshagen et al. | |
| 7,727,911 B2 | 6/2010 | Yoneda et al. | |
| 7,842,518 B2 | 11/2010 | Miyajima | |
| 8,016,944 B2 | 9/2011 | Kortshagen et al. | |
| 8,168,482 B2 | 5/2012 | Miyata | |
| 8,253,188 B2 | 8/2012 | Kamigaichi et al. | |
| 2005/0239239 A1* | 10/2005 | Takanabe et al. | 438/166 |
| 2006/0001073 A1* | 1/2006 | Chen | H01L 21/7682 257/314 |
| 2006/0051505 A1 | 3/2006 | Kortshagen et al. | |
| 2006/0231884 A1* | 10/2006 | Yonemochi | H01L 21/28273 257/314 |
| 2007/0181960 A1 | 8/2007 | Miyata | |
| 2008/0108153 A1 | 5/2008 | Miyajima | |
| 2009/0023279 A1* | 1/2009 | Kim et al. | 438/594 |
| 2009/0056628 A1 | 3/2009 | Kortshagen et al. | |
| 2009/0181549 A1 | 7/2009 | Yoneda et al. | |
| 2010/0019304 A1* | 1/2010 | Minami et al. | 257/314 |
| 2010/0237398 A1 | 9/2010 | Kamigaichi et al. | |
| 2011/0018074 A1 | 1/2011 | Miyata | |
| 2012/0181633 A1 | 7/2012 | Miyata | |

FOREIGN PATENT DOCUMENTS

| | | |
|---|---|---|
| JP | 2008-508166 A | 3/2008 |
| JP | 2008-117903 A | 5/2008 |
| JP | 2009-170439 A | 7/2009 |
| JP | 2010-98322 A | 4/2010 |
| JP | 2010-225786 A | 10/2010 |
| JP | 2010-287655 A | 12/2010 |
| JP | 2011-124371 A | 6/2011 |

OTHER PUBLICATIONS

Dennis Hausmann et al., "Rapid Vapor Deposition of Highly Conformal Silica Nanolaminates" Science, vol. 298, Oct. 11, 2002, pp. 402-406.

* cited by examiner

NON-UNIFORM SILICON DIOXIDE AND AIR GAP FOR SEPARATING MEMORY CELLS

CROSS REFERENCE TO RELATED APPLICATION

This application is based upon and claims the benefit of priority from prior Japanese Patent Application No. 2012-60835, filed on Mar. 16, 2012, the entire contents of which are incorporated herein by reference.

FIELD

Embodiments of the present invention relate to a semiconductor device, and a method for forming the same.

BACKGROUND

In a semiconductor device, and a process for producing the device, a silicon oxide film is used for various use purposes. For example, a silicon oxide film is used as a side-wall-protecting member, an insulating member between interconnects, a cell insulating film, or some other member.

However, as the shrinkage of semiconductor devices and a rise in the integration degree thereof are advanced, the area and volume of sites where silicon oxide films are used are increased in each of the semiconductor devices. Thus, in the production of the semiconductor devices, the proportion of a period necessary for the step of forming the silicon oxide films becomes high. Accordingly, in order to shorten the period for the semiconductor device production, it is desired to improve the film-depositing rate of the silicon oxide films. Of course, even when semiconductor devices are shrunken, their silicon oxide films are required to be conformal films.

Thus, as a method for forming such a conformal silicon oxide film, suggested is a method of using an aluminum catalyst, and tris(tert-butoxy)silanol (TBS) or tris(tert-pentoxy)silanol (TPS). However, from the viewpoint of mass-productivity, it is desired to improve the silicon oxide film in film-depositing rate.

DETAILED DESCRIPTION OF THE INVENTION

In one embodiment, a method for forming a semiconductor device, includes: forming a first underlayer film that contains a first atom selected from the group consisting of germanium, aluminum, tungsten, hafnium, titanium, tantalum, nickel, cobalt and alkaline earth metals; forming, on the first underlayer film, a second underlayer film that contains a second atom selected from the group consisting of germanium, aluminum, tungsten, hafnium, titanium, tantalum, nickel, cobalt and alkaline earth metals, the second atom being an atom not contained in the first underlayer film; and forming, on the second underlayer film, a silicon oxide film by a CVD or ALD method by use of a silicon source containing at least one of an ethoxy group, a halogen group, an alkyl group, and an amino group, or a silicon source of a siloxane system.

Hereinafter, embodiments of the invention will be described with reference to the drawings. However, the invention is not limited to the embodiments. To any member or portion common to all the figures is attached a common reference number. Overlapped description thereof is omitted. The figures are each a schematic view to promote the explanation of the invention and the outstanding thereof, and any shape, dimension, ratio or other factor shown in the figure may be different from that about an actual subject (such as an actual device) of the subject shown by the figure. However, such a factor may be appropriately changed or modified, from the viewpoint of design, with reference to the following description and any known technique.

First Embodiment

With reference to FIGS. 1A to 1D, the present embodiment will be described. The description will be made, giving, as an example, a method for depositing a silicon oxide film over a semiconductor substrate in a method for forming a semiconductor device.

Figure 1A:
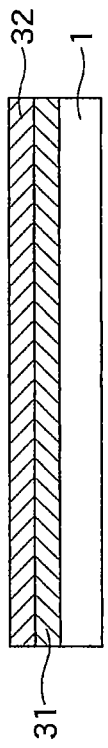
FIGS. 1A to 1D are each a view referred to for describing a method for forming a semiconductor device according to a first embodiment of the present invention.

First, as illustrated in FIG. 1A, a semiconductor substrate 1 is prepared. This semiconductor substrate 1 is not limited to any silicon substrate, and may be a different substrate (for example, a SiGe substrate). On/in a surface thereof may be formed various films, steps, structures such as a semiconductor element, or others.

Figure 1B:

Next, as illustrated in FIG. 1B, germanium atoms are adsorbed onto the surface of the semiconductor substrate 1 to form an underlayer film (first underlayer film) 31. Although a description will be made hereinafter on the premise that germanium atoms are adsorbed thereonto to form the underlayer film 31, the material of the underlayer film is not limited to germanium atoms in the present embodiment, and may be aluminum atoms, tungsten atoms, hafnium atoms, titanium atoms, tantalum atoms, nickel atoms, cobalt atoms, alkaline earth metal atoms, or atoms of some other species. The underlayer film 31 formed by the adsorption of germanium atoms may be made into any film state, such as into the state of a film of any one of a metal, an oxide, a nitride, a boride, a sulfide and others, or into the state of a film of a mixture of two or more thereof. The underlayer film is not limited to any crystal film, and may be an amorphous film. When the underlayer film is made into an oxide, nitride, boride or sulfide film, after the adsorption of germanium atoms, a processing as will be described later is conducted to form the underlayer film 31. In a case where the underlayer film 31 contains easily oxidizable atoms, the front surface of the underlayer film 31 may be oxidized in a subsequent step even when the underlayer film 31 is a metal film, a nitride film, a boride film or a sulfide film.

The concentration of atoms or some other chemical element in the underlayer film 31 needs to be 1e12 atoms/$cm^2$ or more in order to increase the film-depositing rate of a silicon oxide film 4, which is to be deposited over the underlayer film 31. The upper limit of the density is not particularly limited. However, when the underlayer film 31 is required to have a good electrically insulating performance for the silicon oxide film 4, the concentration of the atom is preferably adjusted to set the surface density thereof to 1e16 atoms/$cm^2$ or less. For example, when the underlayer film 31 is a germanium oxide film and the concentration of the germanium atom therein is desired to be a value of not less than 1e12 atoms/cm² and not more than 1e16 atoms/cm², the film thickness of the underlayer film 31 is not less than 0.003 nm and not more than 3 nm.

For the formation of the underlayer film 31, various methods may be used. Examples thereof include an atomic laser deposition (ALD) method, which will be specifically described later; chemical vapor deposition (CVD) methods, such as a method of introducing a gas containing the atoms into a processing furnace, for example, a metal organic chemical vapor deposition (MOCVD) method; physical vapor deposition (PVD) methods of attaining the adsorption of physically excited atoms, for example, a sputtering method; painting methods, such as a method of painting a solution containing the atoms onto the semiconductor substrate 1; dipping methods of dipping the semiconductor substrate 1 in a solution containing the atoms; and spray methods, such as a method of spraying a solution containing the atoms into a gaseous form.

The formation of the underlayer film 31 is performed preferably under conditions that the underlayer film 31 can be formed as a thin film. For example, it is preferred to perform the formation at temperature of not less than room temperature and not more than 600° C. The reaction for the surface adsorption is a competition reaction between the adsorption of the atoms and the elimination thereof; thus, if the temperature is too high, the atom elimination becomes dominative so that the atoms are not easily adsorbed to give a desired concentration.

More specifically, the formation of the underlayer film 31, which is the germanium-atom-containing oxide film, is attained, for example, by depositing the unit of an atomic monolayer repeatedly, using an ALD method of repeating the following sequence plural times: a sequence of introducing germane (germanium hydride) into a furnace having a reduced pressure at a film-depositing temperature of 200 to 600° C., purging the inside of the furnace with an inert gas, supplying an oxidizer such as ozone thereinto, purging the inside, and again introducing germane thereinto. The oxidizer may be, for example, water, oxygen, ozone, nitrogen suboxide, or radical oxygen excited by a physical method. When the underlayer film 31 is desired to become a nitride film, it is advisable to introduce, into the furnace, a nitriding agent instead of the oxidizer. The nitriding agent may be, for example, ammonia, hydrazine, or radical nitrogen excited by a physical method. Similarly, when the underlayer film 31 is desired to become a boride film, it is advisable to use, as a boriding agent, a boron compound such as diborane or boron chloride. When the underlayer film 31 is desired to become a sulfide film, it is advisable to use, as a sulfurizing agent, hydrogen sulfide, or some other.

When the underlayer film 31 is formed by the adsorption of, for example, tungsten atoms, tungsten hexafluoride may be used. In the case of hafnium atoms and aluminum atoms, tetradimethylhafnium and trimethylaluminum (TMA) may be used, respectively. Sources for these atoms are not limited, and may be various sources each containing desired atoms.

Figure 1C:
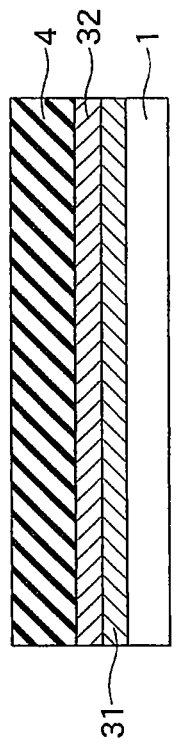

Next, as illustrated in FIG. 1C, aluminum atoms are adsorbed onto the front surface of the underlayer film 31 to form an underlayer film (second underlayer film) 32. Although a description will be made hereinafter on the premise that aluminum atoms are adsorbed thereonto to form the underlayer film of absorbed molecules 32, the material of the underlayer film of absorbed molecules 32 is not limited to aluminum atoms in the present embodiment. The material may be atoms that are not contained in the underlayer film 31, and that are germanium atoms, tungsten atoms, hafnium atoms, titanium atoms, tantalum atoms, nickel atoms, cobalt atoms, alkaline earth metal atoms, and/or atoms of some other species.

In the same manner as in the case of the underlayer film 31, the underlayer film of absorbed molecules 32 formed by the adsorption of aluminum atoms may be made into any film state, such as into the state of a film of any one of a metal, an oxide, a nitride, a boride, a sulfide and others, or into the state of a film of a mixture of two or more thereof. The method for forming the underlayer film of absorbed molecules 32 is also the same as used to form the underlayer film 31. In a case where the underlayer film of absorbed molecules 32 contains easily oxidizable atoms, the front surface of the underlayer film of absorbed molecules 32 may be oxidized in a subsequent step even when the underlayer film of absorbed molecules 32 is a metal film, a nitride film, a boride film or a sulfide film.

Figure 2:
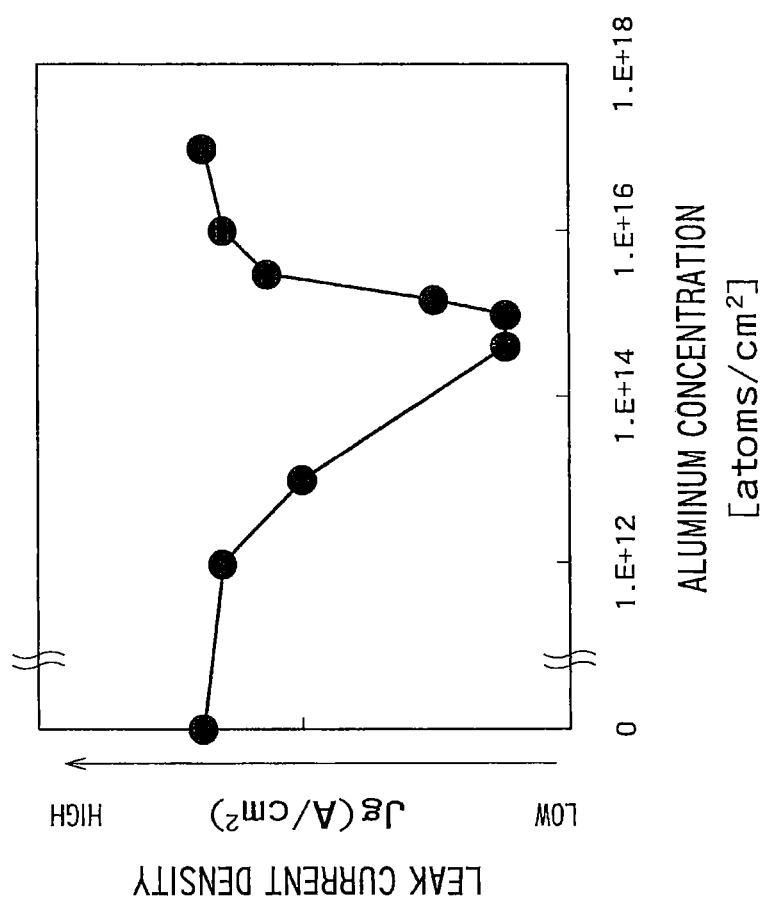
FIG. 2 and FIG. 3 are each a graph referred to for describing the embodiment of the invention.

In the same manner as in the case of the underlayer film 31, the concentration of the atom of aluminum or some other in the underlayer film of absorbed molecules 32 needs only to permit the surface density thereof to be 1e12 atoms/cm² or more in order to increase the silicon oxide film 4 in film-depositing rate. The upper limit of the density is not particularly limited. However, when the underlayer film of absorbed molecules 32 is required to have a good electrically insulating performance for the silicon oxide film 4, which is to be deposited on the underlayer film of absorbed molecules 32, the concentration of the atom is preferably adjusted to set the surface density thereof to 1e16 atoms/cm² or less. This concentration of the atom is based on results obtained from experiments made by the inventors. Specifically, the inventors formed underlayer films containing aluminum atoms in various concentrations onto silicon substrates, respectively, and deposited a silicon oxide film onto each of the resultants. In this way, plural samples were formed. The samples were then examined about the relationship between the concentration of the aluminum atoms and the leak current generated. Details thereof are as follows: the samples were samples obtained by a method of forming underlayer films containing aluminum atoms in various concentrations onto silicon substrates, respectively, by use of an ALD method using TMA as an aluminum source under conditions that the film-depositing temperature ranged from room temperature to 500° C., and the film-depositing pressure ranged from 0.1 to 10 Torr, and then depositing a silicon oxide film onto each of the underlayer film by use of a CVD method using tetraethoxysilane (TEOS) as a silicon source under conditions that the flow rate thereof ranged from 10 to 2000 sccm, the film-depositing pressure ranged from 0.1 to 760 Torr, and the film-depositing temperature ranged from 600 to 750° C.; and electrons were injected to the silicon oxide film of each of these samples from the silicon substrate side thereof, and then the leak current (generated in the sample) was measured. In this way, results shown in FIG. 2 were obtained. According to FIG. 2, it is understood that an effect of decreasing the leak current is obtained when the concentration of the aluminum atom is not less than 1e12 atoms/cm² and not more than 1e16 atoms/cm². For example, when the underlayer film of absorbed molecules 32 is an aluminum oxide film and it is desired to obtain an aluminum atom concentration of not less than 1e12 atoms/cm² and not more than 1e16 atoms/cm², the film thickness of the underlayer film of absorbed molecules 32 is not less than 0.001 nm and not more than 1 nm.

For the adsorption of the aluminum atoms, various methods may be used in the same manner as in the case of the underlayer film 31. Examples thereof include an ALD method; CVD methods such as an MOCVD method; PVD methods, such as a sputtering method; painting methods; dipping methods; and spray methods. The adsorption of the atoms is performed preferably under conditions that the underlayer film of absorbed molecules 32 can be formed as a thin film. For example, it is preferred to perform the adsorption at the temperature of not less than room temperature and not more than 600° C.

Figure 1D:

Next, as illustrated in FIG. 1D, a silicon oxide film 4 is formed on the underlayer film 31 and the underlayer film of absorbed molecules 32. The deposition of the silicon oxide film 4 is attained on the laminate composed of the underlayer film 31 and the underlayer film of absorbed molecules 32, which contain the atoms different from each other, thereby making it possible to increase the silicon oxide film 4 in film-depositing rate, details thereof being to be described later. The deposition of the silicon oxide film 4 may be attained by any method, for example, an ALD method of using a silicon source as will be specifically described below to repeat the adsorption of silicon atoms and the oxidization thereof alternately, or a CVD or plasma CVD method, wherein a silicon source and an oxidizer are simultaneously supplied into a furnace. The deposition of the silicon oxide film 4 is performed preferably at the temperature of not less than room temperature and not more than 800° C. in order to avoid a deterioration in the films other than the film 4 by heat, or other inconveniences. The deposition of the silicon oxide film 4 is achieved preferably through a discontinuous processing of exposing the semiconductor substrate 1 over which the underlayer film 31 and underlayer film of absorbed molecules 32 are formed to the atmosphere once and then performing the deposition in another furnace, or through a continuous processing of reducing the pressure in the underlayer film-forming furnace without exposing the semiconductor substrate 1 to the atmosphere, and then performing the deposition in the same furnace, or another continuous processing of performing the deposition in a different furnace without exposing the semiconductor substrate 1 to the atmosphere.

The silicon source for performing the deposition of the silicon oxide film 4 may be, for example, silane, disilane, a silicon source containing at least one of a halogen group, an ethoxy group, alkyl groups and amino groups, or a silicon source of a siloxane system. Detailedly, examples of the silicon source containing a halogen group include dichlorosilane (DCS), hexachlorodisilane (HCD); examples of the source containing an ethoxy group, tetraethoxysilane (TEOS); examples of the source containing an amino group, trisdimethylaminosilane, bis-tert-butylaminosilane (BTBAS), and diisopropylaminosilane; examples of the source containing an alkyl group, tetramethylsilane; and examples of the source containing a siloxane, tetramethylcyclotetrasiloxane, and octamethylcyclotetrasiloxane. Other examples of the silicon source include compounds each having both of an amino group and an alkyl group, such as hexamethyldisilazane.

The silicon sources given above do not contain any hydroxide group, this situation being different from that of silanol compounds. Accordingly, by using one or more selected from the silicon sources given above to deposit a film, it is possible to avoid a matter that many dangling bonds are generated in the silicon oxide film 4. Thus, the silicon oxide film 4 can be obtained as a good film. The silicon sources given above are inexpensive so that costs can be decreased for the production of the semiconductor device. Furthermore, in the embodiment, the silicon oxide film is not formed by painting a solution of polysilazane or some other compound (by any painting method), but is deposited by an ALD method or CVD method; thus, in the silicon oxide film 4, the quantity of carbon can be restrained, as compared with that of carbon in a silicon oxide film formed by any painting method. In the embodiment, the quantity of carbon in the silicon oxide film 4 can be adjusted to, for example, a concentration of not more than 1e19 atoms/cm$^3$.

In order to make the silicon oxide film 4 highly dense, the workpiece may be subsequently annealed. The workpiece may be subjected to oxidizing treatment in order to compensate for the deficiency of oxygen in the silicon oxide film 4.

When the film thickness of the silicon oxide film 4 to be obtained becomes 100 nm or more in the embodiment, it is allowable, for exhibiting the advantageous effects of the underlayer film 31 and underlayer film of absorbed molecules 32 sufficiently to increase the film-depositing rate of the silicon oxide film 4, to repeat a process of forming the underlayer film 31 and underlayer film of absorbed molecules 32, and then depositing the silicon oxide film 4 until the film thickness of the silicon oxide film 4 turns into a desired value. The process is, for example, a process wherein whenever the silicon oxide film 4 is deposited to have a predetermined film thickness, the deposition of the silicon oxide film 4 is once stopped and again the following step is performed: the underlayer film 31 and underlayer film of absorbed molecules 32 are formed thereon, and then the silicon oxide film 4 is formed thereon to have the same predetermined film thickness.

The embodiment may be performed in a batch furnace, wherein semiconductor substrates 1 can be simultaneously processed, or in a single wafer furnace, wherein a single semiconductor substrate 1 can be processed.

In the embodiment, the description has been made on the premise that the underlayer film 31 and underlayer film of absorbed molecules 32 are each a film. However, the underlayer film 31 and underlayer film of absorbed molecules 32 in the embodiment are each not limited into any film form. It is allowable to use, instead of the film-form underlayer film 31 and underlayer film of absorbed molecules 32, the following form: a form that two atoms which are different from each other and are usable in the embodiment, such as germanium and aluminum atoms, are present (provided) between the semiconductor substrate 1 and the silicon oxide film 4.

According to the embodiment, the underlayer film 31 and underlayer film of absorbed molecules 32, which are a laminate including two different atoms, are formed and then the silicon oxide film 4 is formed thereon, thereby making it possible to increase the film-depositing rate of the silicon oxide film 4. Accordingly, the silicon oxide film 4 can be obtained as a desired film in a shorter period so that the production period of the semiconductor device can be made shorter. Hereinafter, details thereof will be described hereinafter.

Figure 3:
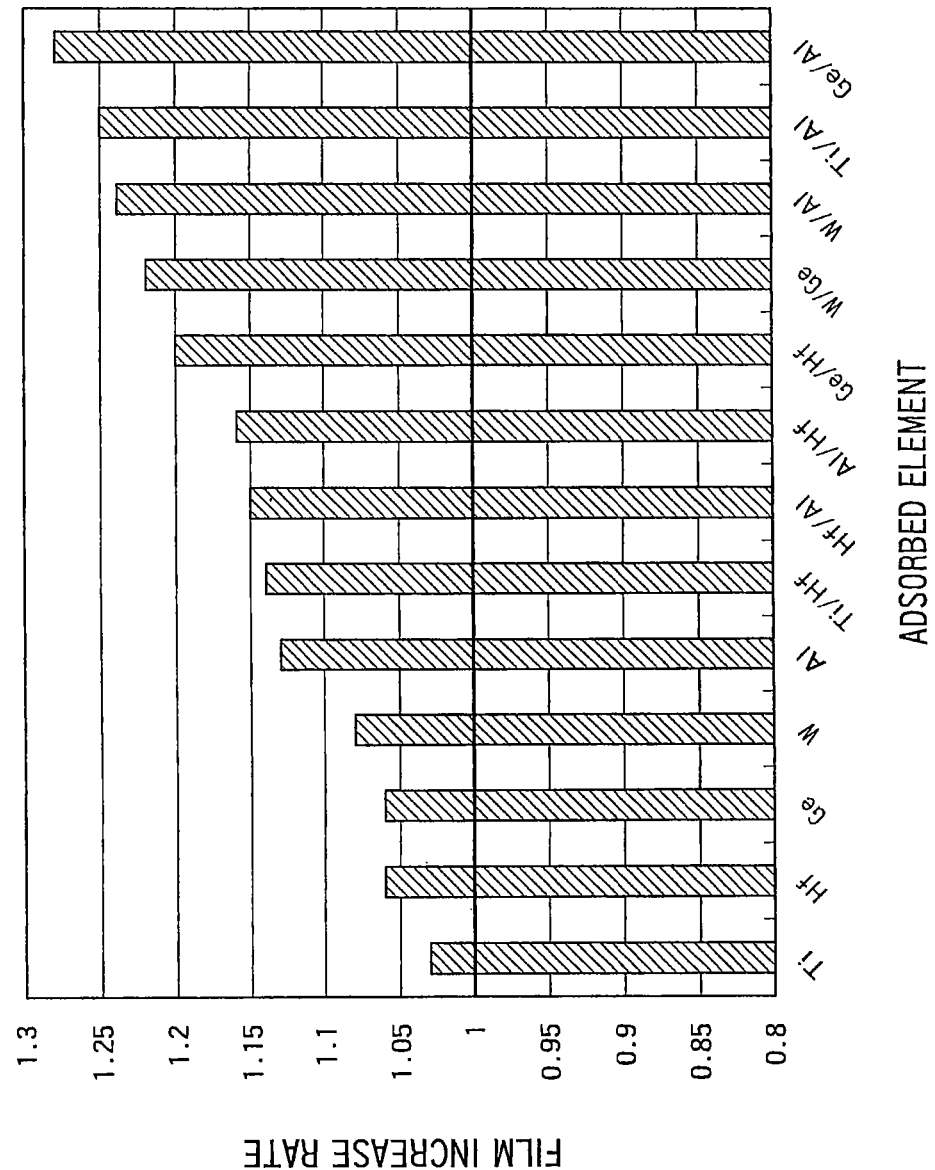

The inventors formed underlayer films containing various atoms onto silicon substrates, respectively, under the same conditions; formed a silicon oxide film on each of the underlayer films; and then evaluated the silicon oxide films by themselves. FIG. 3 shows the respective film thicknesses of the silicon oxide films in this case in order to be compared with each other.

Details thereof are as follows: in FIG. 3, out of all the sample, a reference sample (sample about the film increase rate (i.e., the rate of an increase in the film-depositing rate) was 1) was a sample obtained by using TEOS and ozone to deposit a silicon oxide film on a silicon substrate at a film-depositing temperature of 550° C. by an ALD method; the film thickness of this silicon oxide film was 6 nm; the other samples were each a sample obtained by adsorbing, onto a silicon substrate, one atoms or two different atoms out of aluminum, titanium, hafnium, germanium and tungsten atoms, and further depositing a silicon oxide film thereon under the same conditions as used to deposit the above-mentioned silicon oxide film, the film thickness of which was 6 nm; and the film thickness of each of the resultant silicon oxide films was compared with that of the oxide film of the reference sample. The film thickness of each of the silicon oxide films was measured by an electrical method using a metal-insulator-semiconductor (MIS) capacitor. About each sample wherein two different atoms were adsorbed out of all the samples, in FIG. 3, the left-side atoms shows atoms adsorbed firstly onto the silicon substrate, and the right-side atoms shows secondly adsorbed atoms. In other words, for example, Ge/Al, which is the first atoms combination from the right in FIG. 3, demonstrates that Ge atoms were firstly adsorbed onto a silicon substrate and Al atoms were secondly adsorbed thereonto. From FIG. 3, it is understood that in any underlayer film obtained by adsorbing two different atoms, a silicon oxide film deposited thereon is increased in film-depositing rate. In FIG. 3, each of the atoms combinations is represented under conditions that the order of the respective depositions of the two atoms is clearly shown. However, the inventors' experiments demonstrated that when two atoms to be adsorbed are not varied, substantially the same film increase rate is obtained regardless of the order of the respective adsorptions of the two atoms. It is presumed that when two different atoms are present, the atoms exhibit a larger catalytic effect than when a single atom is present alone so that the film-depositing rate of a silicon oxide film deposited on the two atoms is increased.

Accordingly, when an underlayer film that is a laminate containing two different atoms is formed and then a silicon oxide film is deposited thereon, the film-depositing rate of the silicon oxide film can be increased. Thus, the silicon oxide film can be obtained as a desired film in a short period so that the period for producing the semiconductor device can be made short. Furthermore, the film-depositing rate of the silicon oxide film can be increased without raising the film-depositing temperature largely, so that a deterioration of other films by heating, or other inconveniences can be avoided.

Additionally, according to the embodiment, by use of the silicon source having no hydroxyl group to deposit the silicon oxide film, it is possible to avoid a matter that many dangling bonds are generated in the silicon oxide film. Thus, the silicon oxide film can be formed into a good quality. Furthermore, according to the embodiment, the silicon oxide film is deposited by an ALD or CVD method; thus, in this silicon oxide film, the quantity of carbon can be restrained, as compared with that of carbon in a silicon oxide film formed by any painting method. Moreover, an inexpensive silicon source can be used so that costs for producing the semiconductor device can be decreased.

Second Embodiment

Figure 4:
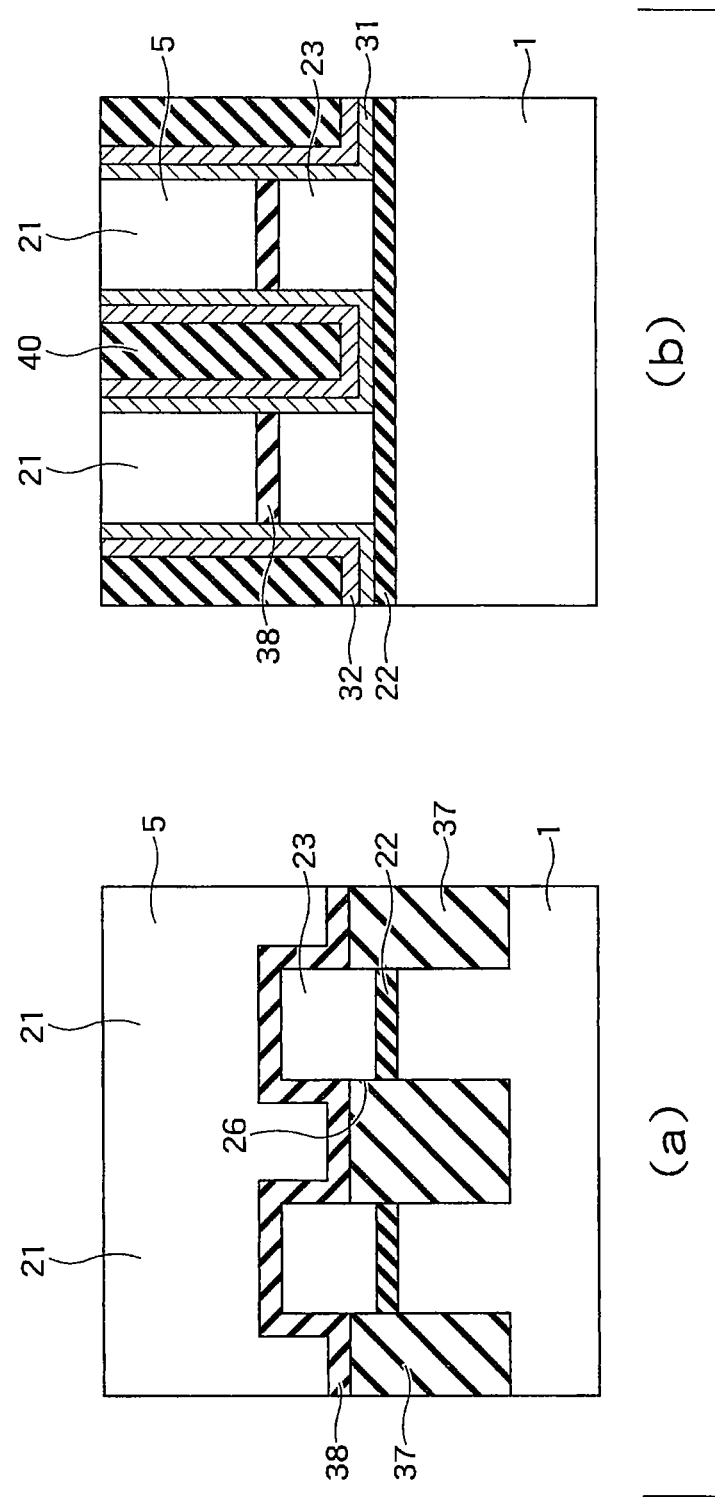
FIG. 4 is a view illustrating each cross section referred to for describing a semiconductor memory device according to a second embodiment.

With reference to FIGS. 4(a) and 4(b), the present embodiment will be described. The description will be made, giving, as an example, a case where the present invention is applied to an interlayer dielectric film 40 in a floating gate (FG) type semiconductor memory device (nonvolatile semiconductor memory device). However, the invention is not limited to this case. Thus, the invention is applicable to any other semiconductor device or some other device, or a moiety thereof. In the following description of the embodiment, to any member or portion that has the same structure and function as the member or portion in the first embodiment is attached the same reference number as in the first embodiment, and description thereof is omitted. FIG. 4 illustrates sectional views of a memory cell region of a semiconductor memory device. In more detail, a part (a) thereof is a sectional view of the semiconductor memory device obtained by cutting this device along its word lines, and a part (b) thereof is a sectional view thereof obtained by cutting the device along its bit lines.

Specifically, as illustrated in the part (a) of FIG. 4, the semiconductor memory device of the embodiment has a semiconductor substrate 1, and memory cells 21 formed on the semiconductor substrate 1. The memory cells 21 are each made of a laminate composed of a gate insulating film 22 and a charge storage film (FG) 23. The memory cells 21 are separated from each other through an element isolation trench 26 made in the semiconductor substrate 1. An element isolation insulating film 37 that is a silicon oxide film formed by a painting method is buried in the element isolation trench 26. An interpoly dielectric 38 is formed to cover the upper surfaces of the memory cells 21 and the upper surface of the element isolation insulating film 37. A control electrode film 5 is formed thereon.

In the semiconductor memory device of the embodiment, which has the semiconductor substrate 1 and the memory cells 21 formed on the semiconductor substrate 1 as illustrated also in the part (b) of FIG. 4, the interpoly dielectric 38 and the control electrode film 5 being over the memory cells 21, any adjacent two of the memory cells 21 are isolated from each other through the interlayer dielectric film 40, which is the silicon oxide film. In the same manner as in the first embodiment, an underlayer film 31 and an underlayer film of absorbed molecules 32 are laid between the interlayer dielectric film 40 and the memory cells 21. In the same manner as in the first embodiment, each of the underlayer film 31 and underlayer film of absorbed molecules 32 is not limited to a film containing germanium atoms or aluminum atoms, or an oxide film. In order to insulate the respective layers constituting the memory cells 21 electrically from each other, the underlayer film 31 and underlayer film of absorbed molecules 32 are each preferably an insulating film such as an oxide film or a nitride film. The respective atom concentrations in the underlayer film 31 and underlayer film of absorbed molecules 32 are preferably equivalent to those in the first embodiment.

In connection with the present embodiment, the present invention is not limited to a case of forming a single laminate composed of the underlayer film 31 and underlayer film of absorbed molecules 32, and the interlayer dielectric film 40. Thus, in the invention, such plural laminates may be formed.

In the embodiment also, the description has been made on the premise that the underlayer film 31 and underlayer film of absorbed molecules 32 are each a film. However, the underlayer film 31 and underlayer film of absorbed molecules 32 in the embodiment are each not limited into any film form. In the same way as in the first embodiment, it is allowable to use, instead of the film-form underlayer film 31 and underlayer film of absorbed molecules 32, the following form: a form that two atoms which are usable in the embodiment and are different from each other, such as germanium and aluminum atoms, are present (provided) between the interlayer dielectric film 40 and the memory cells 21.

The method for forming the semiconductor memory device of the embodiment may be a well-known method for forming a semiconductor memory device provided that when the interlayer dielectric film 40 is formed, the same method as used in the first embodiment is used to form the underlayer film 31 and underlayer film of absorbed molecules 32 and then form the interlayer dielectric film 40, which is a silicon oxide film, thereon.

According to the embodiment, the underlayer film 31 and underlayer film of absorbed molecules 32, which are a laminate including different atoms, are formed and the interlayer dielectric film 40, which is a silicon oxide film, is formed thereon, thereby making it possible to increase the film-depositing rate of the interlayer dielectric film 40. Accordingly, the interlayer dielectric film 40 can be obtained as a desired film in a shorter period so that the period for producing the semiconductor device can be made shorter. Additionally, the film-depositing rate of the interlayer dielectric film 40 can be increased without raising the film-depositing temperature largely, so that a deterioration of other films by heating, or other inconveniences can be avoided. Moreover, according to the embodiment, by use of the silicon source having no hydroxyl group to deposit the interlayer dielectric film 40, it is possible to avoid a matter that many dangling bonds are generated in the film 40. Thus, the interlayer dielectric film 40 can be formed into a good quality. Furthermore, the interlayer dielectric film 40 is deposited by an ALD or CVD method; thus, in this film, the quantity of carbon can be restrained, as compared with that of carbon in an interlayer dielectric film formed by any painting method. In the embodiment, the quantity of carbon in the interlayer dielectric film 40 can be adjusted to, for example, not more than 1e19 atoms/cm$^3$.

In connection with the embodiment, the invention is not limited to the case where the underlayer film 31 and underlayer film of absorbed molecules 32 are laid between the memory cells 21 and the interlayer dielectric film 40 as illustrated in FIGS. 4(a) and 4(b). Thus, such underlayer film may be laid at two positions, that is, between the memory cells 21 and the element isolation insulating film 37, as well as between the memory cells 21 and the interlayer dielectric film 40, or may be laid at either one of the two positions. In this case, the interlayer dielectric film 37 contacting the underlayer film 31 and underlayer film of absorbed molecules 32, and/or the interlayer dielectric film 40 is/are formed by an ALD method or CVD method in the same way as in the first embodiment.

Third Embodiment

With reference to FIG. 5A to FIG. 5E, the present embodiment will be described. The description will be made, giving, as an example, an FG type semiconductor memory device (nonvolatile semiconductor memory device). However, the invention is not limited to this example. Thus, the invention is applicable to any other semiconductor device or some other device, or a moiety thereof. In the following description of the embodiment, to any member or portion that has the same structure and function as the member or portion in the first or second embodiment is attached the same reference number as in the first or second embodiment, and description thereof is omitted. FIG. 5A to FIG. 5E are each a view of a cross section of a memory cell region of a semiconductor memory device in one out of individual steps of a process for producing this device. These cross-sectional views each correspond specifically to a cross section of the semiconductor memory device obtained by cutting this device along its bit lines.

First, a gate insulating film 22 which is, for example, a silicon oxide film is formed into a film thickness of, for example, about 1 to 15 nm onto a semiconductor substrate (p-type silicon substrate, or an n-type silicon substrate wherein p-type wells are formed thereon) 1. A CVD method is used to form thereonto a charge storage film (FG) 23 which is, for example, a polysilicon film, into a film thickness of about 5 to 50 nm. This charge storage film 23 is not limited to any charge storage film that is a polysilicon film, and may be a silicon nitride film, or a film including a metal or silicon that contains carbon or nitrogen.

Furthermore, a CVD method is used to form a hard mask material (not illustrated) into a film thickness of, for example, about 50 to 200 nm. Next, a photoresist (not illustrated) is painted on the hard mask material, and then the photoresist is patterned by the radiation of light into a pattern form. The photoresist is used as a mask to etch the hard mask material. In this way, the hard mask material is patterned to form a hard mask (not illustrated). Furthermore, the photoresist is removed, and the hard mask is used to etch the charge storage film 23, the gate insulating film 22 and the silicon substrate 1, thereby making an element isolation trench extending in a direction perpendicular to the cross section (i.e., extending the right and left direction of the paper on which each of FIGS. 5A to 5E is drawn). A well-known method, such as a painting method, is used to bury an element isolation insulating film into the element isolation trench. The hard mask is then removed.

Furthermore, an interpoly dielectric (IPD) 38 is formed on the charge storage film 23 and the element isolation insulating film. This interpoly dielectric 38 is, for example, an insulating film composed of three layers of a silicon oxide film, a silicon nitride film, and a silicon oxide film (i.e., an ONO film).

Next, a control electrode film 5 is formed on the interpoly dielectric 38. This control electrode film 5 is composed of three layers of a silicon film 51, a tungsten nitride film 52, and a tungsten film 53. Specifically, a silane is used as a silicon source to deposit the silicon film 51 into a film thickness of, for example, 5 to 100 nm by a low-pressure chemical vapor deposition method (LP-CVD method). The tungsten nitride film 52 is then formed into a film thickness of, for example, 1 to 20 nm by a PVD method. Furthermore, the tungsten film 53 is formed into a film thickness of, for example, 10 to 200 nm by a PVD method. In the embodiment, the description has been made on the premise that the tungsten film 53 is used. However, instead of the tungsten film 53, a metal film may be used which contains aluminum, titanium, tantalum, nickel, cobalt, and/or some other atoms. A silicide film may be used which contains one or more atoms as described herein.

Figure 5A:
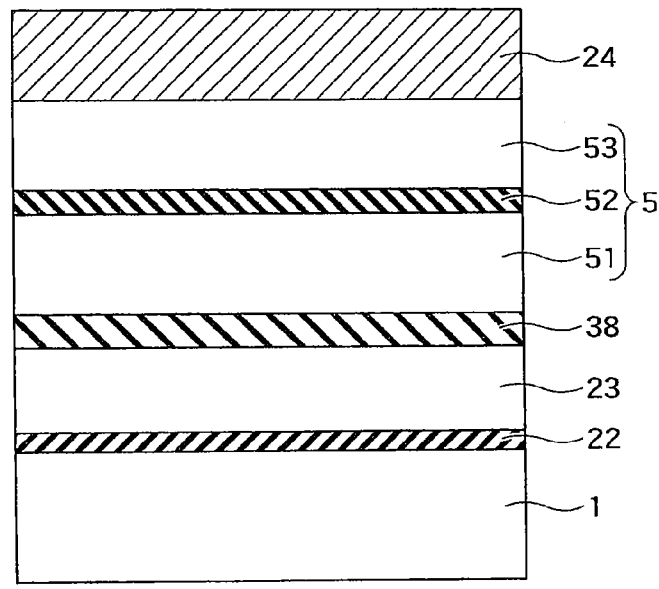
FIG. 5A to FIG. 5E are each a view referred to for describing a method for forming a semiconductor device according to a third embodiment.

A hard mask material 24 which is, for example, a silicon nitride film is formed into a film thickness of, for example, 10 to 200 nm onto the tungsten film 53. In this way, a cross section as illustrated in FIG. 5A can be obtained.

Figure 5B:
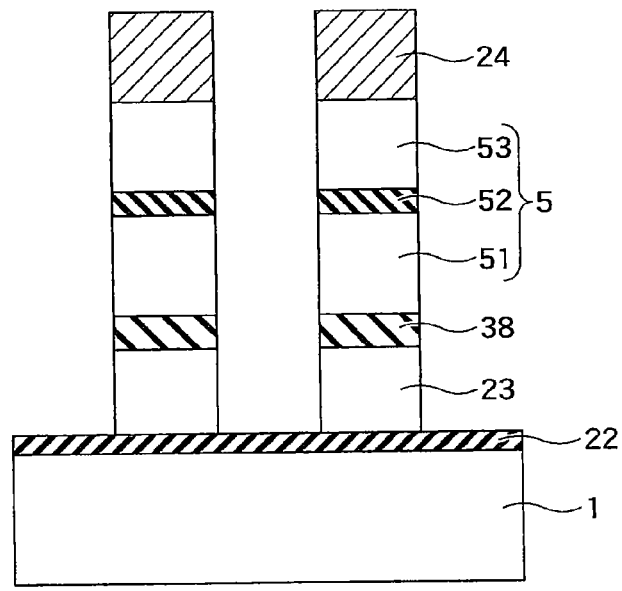

Next, a photoresist (not illustrated) is painted on the hard mask material 24, and then the photoresist is patterned by the radiation of light into a pattern form. The photoresist is used as a mask to etch the hard mask material 24. In this way, the hard mask material 24 is patterned to form a hard mask 34. Furthermore, the photoresist is removed, and the hard mask 34 is used to etch the tungsten film 53, the tungsten nitride film 52, the silicon film 51, the interpoly dielectric 38, and the charge storage film 23, thereby making it possible to yield a cross section as illustrated in FIG. 5B.

Figure 5C:
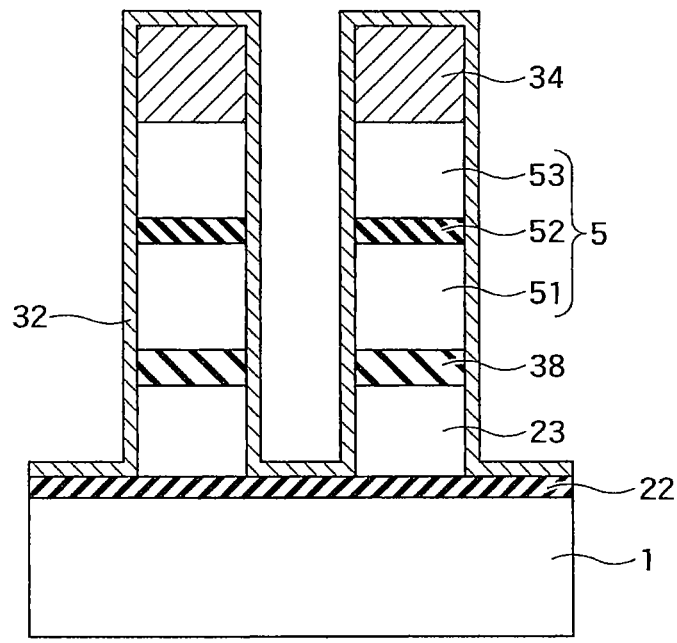

As illustrated in FIG. 5C, in the same manner as in the first embodiment, aluminum atoms are adsorbed onto side walls and the upper surface of the laminate composed of the hard mask 34, the tungsten film 53, the tungsten nitride film 52, the silicon film 51, the interpoly dielectric 38, and the charge storage film 23. This workpiece is oxidized to form an underlayer film of absorbed molecules 32 which is an aluminum oxide film.

The following description will be made on the premise that the underlayer film of absorbed molecules 32, which is the aluminum oxide film, is formed; however, in the embodiment, the underlayer film of absorbed molecules 32 is not limited to any aluminum oxide film. In the same manner as in the first embodiment, the underlayer film may be a film which contains atoms that are not contained in a film corresponding to the tungsten film 53 in the control electrode film 5, and that are germanium atoms, tungsten atoms, hafnium atoms, titanium atoms, tantalum atoms, nickel atoms, cobalt atoms, alkaline earth metal atoms, and/or atoms of some other species. However, in order to attain electrical insulation of the individual layers constituting the laminate, the underlayer film of absorbed molecules 32 is preferably an insulating film, such as an oxide film or a nitride film.

In the same manner as in the first embodiment, in order to increase the film-depositing rate of a silicon oxide film 4 to be formed later, the concentration of the atom of Al or some other in the underlayer film of absorbed molecules 32 needs only to permit the surface density thereof to be 1e12 atoms/cm$^2$ or more. However, in any shrunken semiconductor device, the distance between its laminates is largely reduced; thus, in order to avoid a matter that the electric distance between the laminates in this embodiment becomes short, it is preferred to avoid making the underlayer film of absorbed molecules 32 thick. It is therefore preferred to set the film thickness of the underlayer film of absorbed molecules 32 into the value of not less than 0.001 nm and not more than 1 nm.

In the same manner as in the first embodiment, for the formation of the underlayer film of absorbed molecules 32, various methods may be used. Examples thereof include an ALD method; CVD methods such as an MOCVD method; PVD methods, such as a sputtering method; painting methods; dipping methods; and spray methods.

Figure 5D:
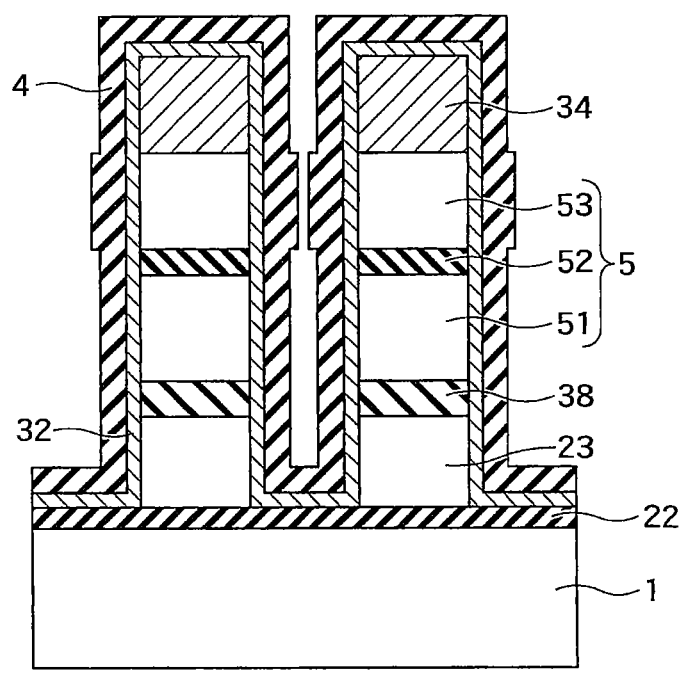

Next, as illustrated in FIG. 5D, a silicon oxide film 4 is formed into a film thickness of, for example, 4 to 10 nm onto the underlayer film of absorbed molecules 32. It is preferred to select, as the film thickness of this silicon oxide film 4, a value permitting a desired breakdown voltage or leak current value to be certainly kept, and permitting an air gap to be made into a desired size. In the same manner as in the first embodiment, for the formation of the silicon oxide film 4, a well-known silicon-oxide-film-forming method may be used, examples thereof including an ALD method, a CVD method, and a plasma CVD method. A silicon source used for forming the silicon oxide film 4 may be the same as used in the first embodiment. The formation of the silicon oxide film 4 is performed preferably at the temperature of not less than room temperature and not more than 800° C. in order to avoid a deterioration of the other films by heating, or other inconveniences. The formation of the silicon oxide film 4 may be performed through a discontinuous process wherein after the formation of the underlayer film of absorbed molecules 32, the workpiece is once exposed to the atmospheric air and then the film 4 is formed in another furnace, or through a continuous process wherein after the formation, the pressure in the furnace concerned is reduced without exposing the workpiece to the atmospheric air, and then the film 4 is formed in the same furnace or another continuous process wherein after the formation, the film 4 is formed in a different furnace without exposing the workpiece to the atmospheric air.

In this way, a catalytic effect based on the coexistence of the tungsten film 53 and the underlayer film of absorbed molecules 32, which is the aluminum oxide film, is produced, thereby increasing the film-depositing rate of the silicon oxide film 4 over the side walls of the tungsten film 53 that the laminate has, as compared with that of the film 4 over the side walls of the other films that the laminate has. Accordingly, the silicon oxide film 4 over the side walls of the tungsten film 53 that the laminate has is, for example, about 1.2 times thicker than the film 4 over the side walls of the other films that the laminate has.

Figure 5E:
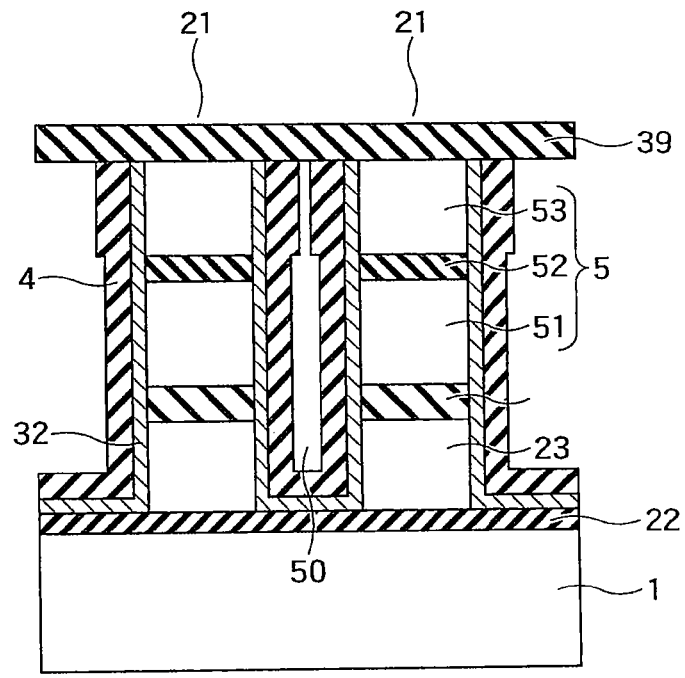

Next, the hard mask 34 is removed to form an insulating film 39 to cover the upper surface of the tungsten film 53 by use of a film-forming technique poor in step coverage performance. As illustrated in FIG. 5E, in this way, a semiconductor memory device can be formed wherein air gaps 50 are arranged between the memory cells 21. The arrangement of the air gaps 50 makes it possible to decrease the parasite capacity between any adjacent two of the memory cells 21.

Figure 6:
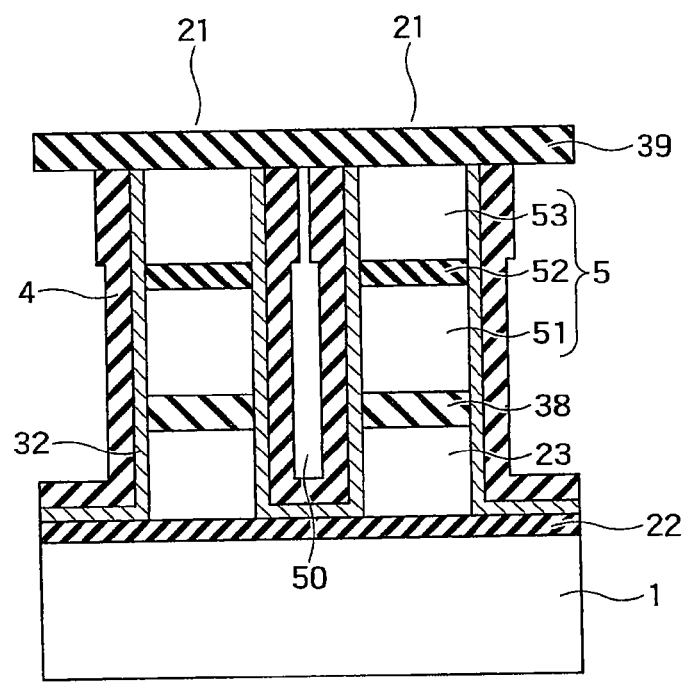
FIG. 6 is a sectional view of the semiconductor device according to the third embodiment.

As illustrated in FIG. 6, the semiconductor memory device of the embodiment has the memory cells 21, which are each composed of the semiconductor substrate 1, the gate insulating film 22, the charge storage film 23, the interpoly dielectric 38 and the control electrode 5. The control electrode 5 of the memory cell 21 has the metal film 53, which contains, besides tungsten, aluminum, titanium, tantalum, nickel, cobalt, silicon or some other atom species. The side walls of each of the memory cells 21 are covered with the underlayer film of absorbed molecules 32, which contains one or more atom species that are not contained in the metal film 53 and are one or more atom species selected from germanium, aluminum, tungsten, hafnium, titanium, tantalum, nickel, cobalt and alkaline earth metals. Furthermore, the side walls of each of the memory cells 21 are covered with the silicon oxide film 4 to interpose the underlayer film of absorbed molecules 32 therebetween. In this silicon oxide film 4, its portion covering the side walls of the film 53 containing the atoms, such as tungsten, in the control electrode 5 is thicker than its portion covering the side walls of the other portion of the memory cell 21. Moreover, the upper surface of the memory cell 21 is covered with the insulating film 39. One of the air gaps 50 is formed between any adjacent two of the memory cells 21. The air gap 50 makes it possible to decrease the parasite capacity between the adjacent two memory cells 21.

As described above, according to the embodiment, a catalytic effect based on the coexistence of the tungsten film 53 and the aluminum oxide film 32 is produced, thereby increasing the film-depositing rate of the silicon oxide film 4 over the side walls of the tungsten film 53 that the laminate has, as compared with that of the film 4 over the side walls of the other films that the laminate has. Accordingly, the silicon oxide film 4 over the side walls of the tungsten film 53 that the laminate has is, for example, about 1.2 times thicker than the film 4 over the side walls of the other films that the laminate has.

In the meantime, conventionally, in a semiconductor memory device having memory cells, an air gap being located between any adjacent two of the memory cells, fine irregularities may be present in side walls of a tungsten film that each of the memory cells has. At the time of applying, in this case, a voltage to the memory cells, an increase may be caused in (or about) the electric field applied to the air gap between convex portions of the side walls of the tungsten film of the adjacent two memory cells, so that a discharge and others may arise. In such a case, dielectric breakdown may arise to cause a deterioration in breakdown voltage of the memory cells, and an element-deficiency. In particular, when the shrinkage of semiconductor memory devices is advanced, the distance between their adjacent memory cells becomes short so that an increase is caused in the electric field applied to air gaps between the memory cells. Thus, a discharge as described above is more remarkably generated.

In the embodiment, however, the silicon oxide film 4 on the side walls of the tungsten film 53 that the laminate has can be made thick. Thus, even when the side walls of the tungsten film 53 have fine irregularities, a decrease can be attained in the electric field applied to the air gaps 50 between convex portions of the side walls of the tungsten film 53 so that dielectric breakdown can be avoided. In short, the embodiment makes it possible to realize a semiconductor memory device which is excellent in breakdown voltage characteristics.

When the silicon oxide film 4 is formed to have a film thickness of, for example, 4 nm on the side walls of the films other than the tungsten film 53 which each of the memory cells 21 has, the silicon oxide film 4 formed on the side walls of the tungsten film 53 has a film thickness of, for example, 5 nm (a thickness of about 1 nm is increased). Accordingly, when the potential difference between any adjacent two of the memory cells 21 is 20 V, a decrease by about 1 V is attained in the electric field applied to the air gap 50 between the convex portions of the tungsten film 53 of the adjacent memory cells 21.

In the embodiment, the charge storage film 23 is not limited to any polysilicon film or any silicon nitride film. The film 23 may contain germanium, aluminum, tungsten, hafnium, titanium, tantalum, nickel, cobalt, any alkaline earth metal, and/or some other atom species. In this case, in the same manner as in the case of the silicon oxide film 4 on the side walls of the tungsten film 53, a catalytic effect based on the coexistence of the atoms contained in the charge storage film 23 and the atoms contained in the underlayer film of absorbed molecules 32 is produced, thereby increasing the film-depositing rate of the silicon oxide film 4 over the side walls of the charge storage film 23. As a result, the film thickness becomes large.

In the embodiment also, the description has been made on the premise that the underlayer film of absorbed molecules 32 is a film. However, the underlayer film of absorbed molecules 32 in the embodiment is not limited into any film form. In the same way as in the first embodiment, it is allowable to use, instead of the underlayer film of absorbed molecules 32, the following form: a form that atoms usable in the embodiment, such as aluminum atoms, are present between the silicon oxide film 4 and each of the memory cells 21.

The embodiment is not limited to any semiconductor memory device. Thus, the embodiment may be applied to a semiconductor device having no charge accumulation layer. The embodiment may also be applied to metal interconnects having air gaps therebetween.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device, comprising:
a semiconductor substrate;
plural memory cells on the semiconductor substrate, the memory cells each comprising a charge storage layer on the semiconductor substrate via a gate insulating film and a control gate on the charge storage layer via a first insulating film, the control gate comprising a first part on the first insulating film; and
a second insulating film on a side wall of each of the memory cells, the second insulating film comprising a second part on the first part and a third part on the second part,
wherein the first part comprises a first metal selected from the group consisting of germanium, aluminum, tungsten, hafnium, titanium, tantalum, nickel, cobalt and alkaline earth metals,
the second part comprises a second metal other than the first metal, the second metal being selected from the same group as the first metal,
the third part is provided with a silicon oxide film comprising a first portion covering the side wall of the first part in a direction parallel to a top surface of the semiconductor substrate and a second portion covering any other portion of each of the memory cells, and
the first portion is thicker at the sidewall of the first part in a direction parallel to the top surface of the semiconductor substrate than the second portion.

2. The semiconductor device according to claim 1, further comprising an air gap between any adjacent two of the memory cells.

3. The semiconductor device according to claim 1, wherein the second metal is comprised in one of a metal film, an oxide film, a nitride film, a boride film, and a sulfide film.

4. The semiconductor device according to claim 1, wherein the second metal constitutes a film of not less than 0.1 nm and not more than 1 nm in thickness.

5. The semiconductor device according to claim 1, wherein the silicon oxide film contains carbon in a concentration of not more than $1 \times 10^{19}$ atoms/cm$^3$.

* * * * *